United States Patent
Fukuda et al.

(10) Patent No.: US 6,927,167 B2
(45) Date of Patent: Aug. 9, 2005

(54) METHOD FOR MANUFACTURING SEMICONDUCTOR DEVICE HAVING CONTROLLED SURFACE ROUGHNESS

(75) Inventors: Yutaka Fukuda, Kariya (JP); Naohiko Hirano, Okazaki (JP); Chikage Noritake, Ama-gun (JP); Shoji Miura, Nukata-gun (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/732,376

(22) Filed: Dec. 11, 2003

(65) Prior Publication Data
US 2004/0119088 A1 Jun. 24, 2004

(30) Foreign Application Priority Data
Dec. 11, 2002 (JP) ........................................ 2002-359942

(51) Int. Cl.⁷ ............................................. H01L 21/302
(52) U.S. Cl. ..................... 438/689; 438/692; 438/745; 438/753
(58) Field of Search ................................. 438/692–693, 438/689, 704, 745, 749–750, 753, 135, 597

(56) References Cited

U.S. PATENT DOCUMENTS

| | | |
|---|---|---|
| 5,242,862 A | 9/1993 | Okabe et al. |
| 2002/0158333 A1 | 10/2002 | Teshima |
| 2002/0167006 A1 * | 11/2002 | Demizu et al. ................ 257/48 |
| 2003/0022464 A1 | 1/2003 | Hirano et al. |
| 2003/0052400 A1 | 3/2003 | Okura et al. |
| 2003/0119281 A1 * | 6/2003 | Suzuki et al. ................ 438/460 |
| 2003/0119332 A1 * | 6/2003 | Kuebelbeck et al. ......... 438/753 |
| 2003/0122232 A1 | 7/2003 | Hirano et al. |
| 2003/0132530 A1 | 7/2003 | Teshima et al. |

FOREIGN PATENT DOCUMENTS

| | | |
|---|---|---|
| JP | A-H11-162927 | 6/1999 |
| JP | A-2001-267469 | 9/2001 |

OTHER PUBLICATIONS

U.S. Appl. No. 09/717,227, filed Nov. 22, 2000, Mamitsu et al.

* cited by examiner

*Primary Examiner*—Thanh Nguyen
(74) *Attorney, Agent, or Firm*—Posz Law Group, PLC

(57) ABSTRACT

A method for manufacturing a semiconductor device with a substrate having a device layer and a backside electrode is disclosed. Here, a surface roughness of the substrate is defined as a ratio between a substantial area and a projected area. The method includes polishing and wet-etching a backside surface of the substrate mechanically with using predetermined abrasive grains so that a surface roughness of the backside surface of the substrate becomes to be equal to or larger than 1.04, and forming the backside electrode on the backside surface of the substrate after polishing and wet-etching the backside surface of the substrate.

14 Claims, 4 Drawing Sheets

METHOD FOR MANUFACTURING SEMICONDUCTOR DEVICE HAVING CONTROLLED SURFACE ROUGHNESS

CROSS REFERENCE TO RELATED APPLICATION

This application is based on Japanese Patent Application No. 2002-359942 filed on Dec. 11, 2002, the disclosure of which is incorporated herein by reference.

FIELD OF THE INVENTION

The present invention relates to a semiconductor device having a controlled surface roughness and a method for manufacturing the same.

BACKGROUND OF THE INVENTION

A method for manufacturing a semiconductor device, which has a low resistance semiconductor substrate to reduce an ON-state resistance of the device, is disclosed in Japanese Patent No. 2513055 (i.e., U.S. Pat. No. 5,242,862). This device is a vertical type power electronic device. The device includes a semiconductor substrate and a backside electrode. The backside electrode is formed on a backside surface of the substrate. A device layer is formed on a foreside surface of the substrate, which is opposite to eth backside surface.

Before forming the backside electrode on the backside surface of the substrate, the backside surface of the substrate is polished so that the thickness of the substrate becomes small. Therefore, the resistance of the substrate is reduced, so that the ON-state resistance of the device is reduced.

However, for example, the substrate 1 is a silicon substrate with a six-inch diameter, i.e., a six-inch silicon wafer, and having a thickness of 600 $\mu$m, and the substrate is polished roughly. The substrate may bend easily, when the thickness of the substrate becomes smaller than 300 $\mu$m. Therefore, it becomes difficult to form the backside electrode on this bent substrate.

On the other hand, when the substrate is polished sensitively, the substrate is limited from bending. However, an amorphous silicon layer is formed on the backside surface of the substrate, which is the polished surface. Therefore, since the amorphous silicon layer is disposed between the substrate and the backside electrode, the backside electrode does not connect to the substrate with ohmic contact. Thus, the contact resistance between the backside electrode and the substrate is increased. Further, since the surface roughness of the backside surface becomes small in case of polishing sensitively, a contact area between the substrate and the backside electrode becomes small, so that the contact resistance therebetween becomes larger. Furthermore, the strength of adhesion therebetween is reduced, so that the backside electrode may be peeled off from the substrate 1.

SUMMARY OF THE INVENTION

In view of the above problem, it is an object of the present invention to provide a semiconductor device having a low ON-state resistance and high bonding strength. It is another object of the present invention to provide a method for manufacturing a semiconductor device having low ON-state resistance and high bonding strength.

A method for manufacturing a semiconductor device is disclosed. The device includes a substrate having a device layer disposed on one side of the substrate and a backside electrode disposed on the other side of the substrate. Here, a surface roughness of the substrate, i.e., RS, is defined as a ratio between a substantial area, i.e., SE, and a projected area, i.e., SP, so that the surface roughness is obtained as RS=SE/SP. The substantial area is an area, which is provided by spreading out a concavity and convexity of a surface of the substrate into a predetermined plane, and the projected area is an area, which is provided by projecting the concavity and convexity of the surface to the predetermined plane. The method includes the steps of polishing the other side of the substrate mechanically with using predetermined abrasive grains so that a silicon layer thickness of the substrate becomes a predetermined thickness; wet-etching the other side of the substrate after the step of polishing the other side of the substrate so that a surface roughness of the other side of the substrate becomes to be equal to or larger than 1.04; and forming the backside electrode on the other side of the substrate after the step of wet-etching the other side of the substrate.

The device manufactured with the above method has a low ON-state resistance and high bonding strength between the substrate and the backside electrode. Further, the manufacturing cost of the device is comparatively low.

Preferably, the step of polishing includes the steps of polishing roughly the other side of the substrate mechanically with using first number abrasive grains so that the surface roughness of the other side of the substrate becomes to be equal to or smaller than 1.056, and polishing sensitively the other side of the substrate with using second number abrasive grains after the step of polishing roughly so that the surface roughness of the other side of the substrate becomes to be equal to or smaller than 1.004. Here, the first number abrasive grains in the step of polishing roughly is abrasive grains having the number of abrasive grains being equal to or larger than 325, and the second number abrasive grains in the step of polishing roughly is abrasive grains having the number of abrasive grains being equal to or larger than 2000. The number of abrasive is defined in Japanese Industrial Standards.

Further, a semiconductor device includes a substrate, a device layer disposed on one side of the substrate, and a backside electrode disposed on the other side of the substrate. The device is a power electronic device. The substrate has a surface roughness, i.e., RS, which is defined as a ratio between a substantial area, i.e., SE, and a projected area, i.e., SP, so that the surface roughness is obtained as RS=SE/SP. The substantial area is an area, which is provided by spreading out a concavity and convexity of a surface of the substrate into a predetermined plane. The projected area is an area, which is provided by projecting the concavity and convexity of the surface to the predetermined plane. The other side of the substrate has a surface roughness being equal to or larger than 1.04.

The above device has a low ON-state resistance and high bonding strength between the substrate and the backside electrode. Further, the manufacturing cost of the device is comparatively low.

Preferably, the device further includes a pair of heat radiation plates, and a resin. The device layer and the backside electrode are sandwiched with the heat radiation plates through a solder. The resin is disposed on the heat radiation plates.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS (First Embodiment)

Figure 1:
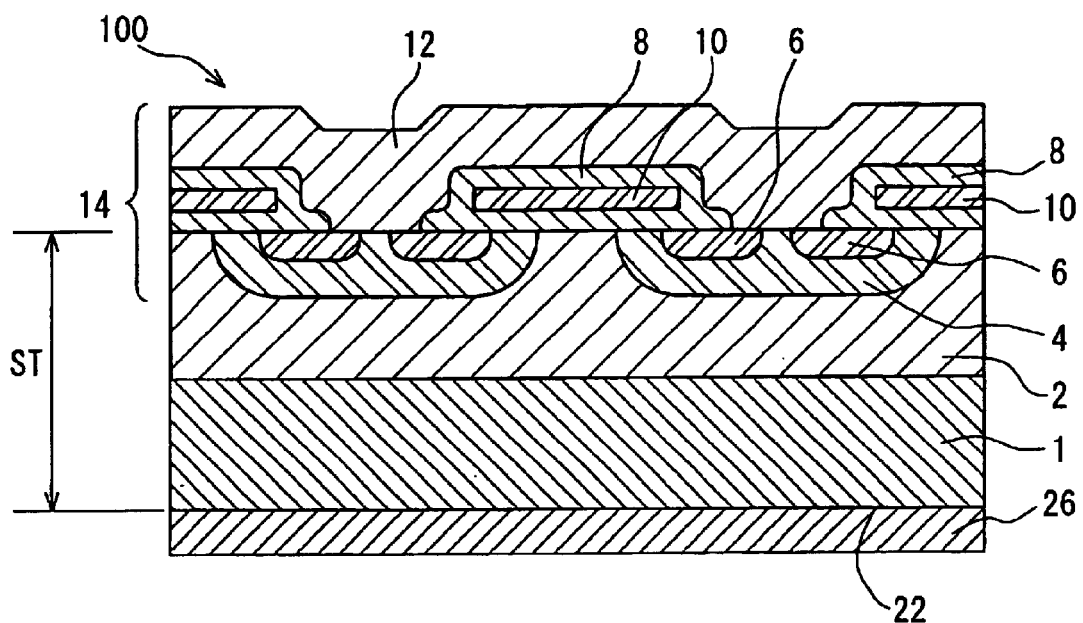
FIG. 1 is a cross-sectional view showing a semiconductor device according to a first embodiment of the present invention.

A semiconductor device 100 according to a first embodiment of the present invention is shown in FIG. 1. This semiconductor device 100 is a vertical type power electronic device. The device 100 includes a semiconductor substrate 1 made of arsenicum (i.e., As) doped silicon. The substrate 1 is a silicon substrate with a six-inch diameter, i.e., a six-inch silicon wafer, and having a thickness of 600 μm. An N-type drain 2 is formed on the substrate 1. In the drain 2, a P-type channel 4 and an N-type source 6 are formed. On the drain 2, a gate 10 with a silicon oxide insulation 8 and a source electrode 12 are formed. The gate 10 is made of poly silicon, and insulated by the silicon oxide insulation 8. The source electrode 12 provides a surface electrode. An ohmic electrode 26 as a backside electrode is formed on a backside surface 22 of the substrate 1. The backside surface 22 is a polished surface of the substrate 1. Here, a silicon layer thickness ST is defined as a sum of the thickness of the substrate 1 and the thickness of the drain 2. That is, the silicon layer thickness ST is a total thickness of silicon layer.

Figure 2:
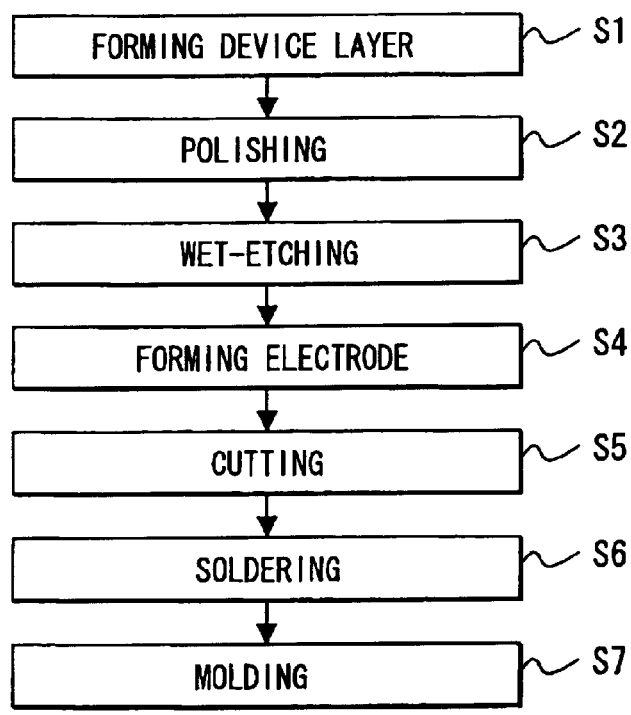
FIG. 2 is a flow chart explaining a method for manufacturing the device according to the first embodiment.

The device 100 is manufactured as follows. FIG. 2 is a flow chart explaining a method for manufacturing the device 100.

At first, as shown Step S1 in FIG. 2, a device layer 14 (i.e., MOS device layer) is formed on a foreside surface of the substrate 1 made of silicon. The foreside surface of the substrate is opposite to the backside surface. Specifically, the N-type drain 2, the P-type channel 4, the N-type source 6, the gate 10 made of poly silicon 10, the silicon oxide insulation 8, and the source electrode 12 as a surface electrode are formed on the substrate 1, respectively.

Next, as shown Step S2 in FIG. 2, the backside surface 22 of the substrate 1, which is opposite to the foreside surface of the substrate, is polished mechanically until the silicon layer thickness ST of the substrate 1 becomes at a predetermined thickness such as 300 μm. This polish is performed by a surface polishing method (i.e., a surface grinding method). In Step S2, predetermined abrasive grains are used for mechanical polishing. The predetermined abrasive grains are, for example, between No. 80 and No. 600 abrasive grains, and made of silicon carbide (i.e., SiC) or diamond (i.e., C). In this way, the substrate 1 is polished roughly so that the thickness of the substrate 1 becomes small. Therefore, the resistance of the substrate 1 is reduced, so that the ON-state resistance of the device 100 is reduced.

Here, the number of abrasive grains is defined in Japanese Industrial Standards, i.e., JIS, and the number such as No. 80 corresponds to a predetermined grain size of the abrasive grains. As the number becomes large, the grain size is reduced qualitatively. This definition is disclosed in JIS R6001 in JIS handbook published by Japanese Standards Association.

When the substrate 1 is polished with using the small number abrasive grains (i.e., the abrasive grains having a large grain size, the large abrasive grains), the polishing can be performed in a short time and low cost. That is, the polishing rate becomes rapidly. However, the polishing surface of the substrate 1 may be cracked. Further, in a case where the polishing surface is cracked, the substrate 1 is bent easily as the thickness of the substrate 1 becomes small.

On the other hand, in a case where the substrate 1 is polished with using small number abrasive grains (i.e., the abrasive grains having a small grain size, the small abrasive grains), the polishing surface is not cracked, so that the substrate 1 is not bent. Thus, the substrate 1 can be polished as thin as possible. However, the polishing rate becomes small, so that manufacturing time for polishing the substrate 1 becomes long. Therefore, the manufacturing cost increases.

In the above view, the substrate 1 is polished with using appropriate number abrasive grains so that the substrate 1 is not bent. Further, as the substrate 1 becomes thinner, the abrasive grains for polishing the substrate 1 become smaller, i.e., the number of the abrasive grains becomes larger. Specifically, for example, the backside surface 22 of the substrate 1 is roughly polished with using No. 325 abrasive grains, and then the backside surface is sensitively polished with using No. 2000 abrasive grains.

Figure 3:
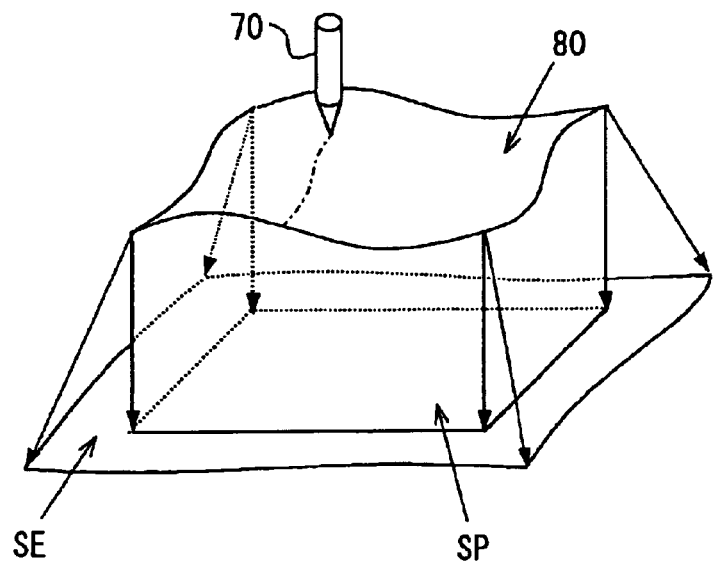
FIG. 3 is a schematic perspective view explaining a surface roughness of a backside surface of the device according to the first embodiment.

Here, a surface roughness RS in this embodiment is defined as follows. As shown in FIG. 3, the surface roughness RS is measured with using an atomic force microscope (i.e., an AFM). A probe 70 of the AFM is scanned on a concavity and convexity 80 of the backside surface 22 with quasi-two-dimensional scan, i.e., planar scan. In this way, the concavity and convexity 80 of the backside surface 22 is spread out into a plane so that a substantial area SE is obtained. This substantial area SE is an area, which is obtained by spreading out the concavity and convexity 80 of the backside surface 22 into a predetermined plane that is shown as SE in FIG. 3. Further, the concavity and convexity 80 of the backside surface 22 is projected to a plane so that a projected area SP is obtained. The projected area SP is a measurement area of the surface, and shown as SP in FIG. 3.

Thus, the surface roughness RS of the backside surface 22 is defined as a ratio of the substantial area SE and the projected area SP, i.e., RS=SE/SP. The contact resistance or the bonding strength between the substrate 1 and the backside electrode 26 depends on the substantial area SE of the concavity and convexity 80 of the backside surface 22. Accordingly, the surface roughness RS provides a criterion of the concavity and convexity 80 of the backside surface 22, which corresponds to the contact resistance or the bonding strength. Here, when the polished surface of the substrate 1 is completely flat, the surface roughness RS is 1.000, i.e., RS=1.000.

Figure 4:
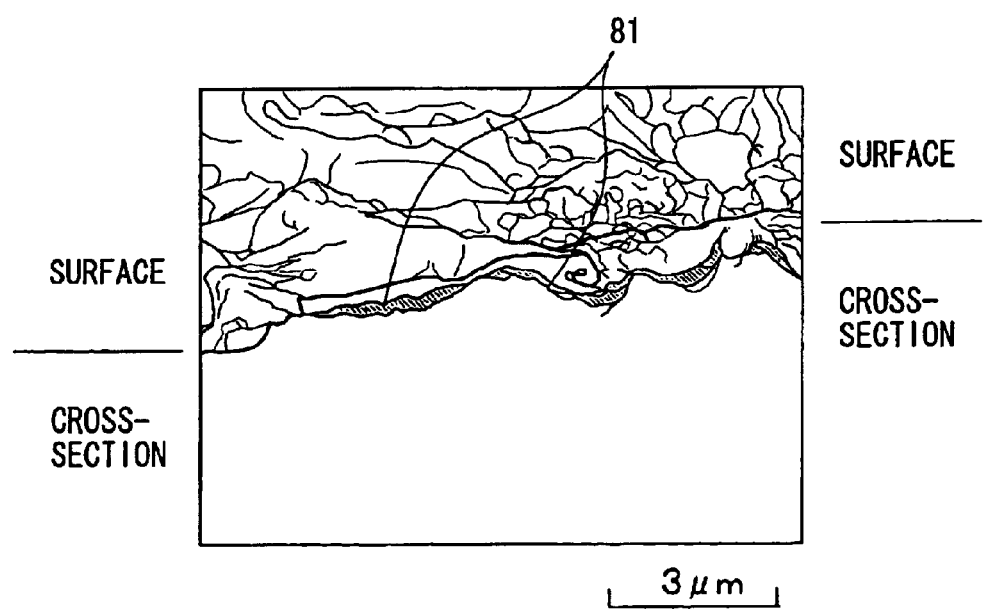
FIG. 4 is a perspective view showing the device after polishing, according to the first embodiment.

FIG. 4 is a perspective view showing the polished surface (i.e., the backside surface 22) of the substrate 1 after being roughly polished with using No. 325 abrasive grains. FIG. 4 is obtained by a scanning electron microscope (i.e., SEM), and the polished substrate 1 is cut and observed obliquely from an upper side of the substrate 1, so that the perspective view shown in FIG. 4 is obtained. As shown in FIG. 4, the polished surface of the substrate 1 has a large concavity and convexity, and has a plurality of cracks 81. This polished surface is measured with using the AFM, so that the surface roughness RS of the polished surface is obtained as 1.056, i.e., RS=1.056.

After the substrate 1 is polished with using No. 325 abrasive grains, the backside surface 22, which is roughly polished, is sensitively polished again with using No. 2000 abrasive grains. This sensitive polish provides the backside surface 22 as a mirror finished surface. The mirror finished surface of the substrate 1 is measured with using the AFM, so that the surface roughness RS of the mirror finished surface is obtained as 1.004, i.e., RS=1.004.

Thus, the backside surface 22 of the substrate 1 is polished mechanically. After that, the backside surface 22 of the substrate 1 is washed with using ultra-purified water. In this way, the substrate 1 is thinned, so that the resistance of the substrate 1 in a thickness direction (i.e., a direction perpendicular to the surface) becomes small. Therefore, the ON-state resistance of the device 100 is reduced.

Next, as shown Step S3 in FIG. 2C, the backside surface 22 of the substrate 1 is wet-etched with using etchant, so that the backside surface 22 becomes a rough piriform surface. This piriform surface has the surface roughness RS being equal to or larger than 1.05, i.e., RS≧1.05. The etchant is, for example, a mixture of hydrofluoric acid, nitric acid and sulfuric acid, and the wet-etching is performed with using a spin etching method. This mixed etchant provides an oxidizing effect for oxidizing the substrate by the nitric acid, an etching effect for etching the oxidized surface of the substrate 1 by the hydrofluoric acid, and an evaporation effect for evaporating moisture on the substrate 1 by the sulfuric acid. Here, the spin etching method is such that the substrate 1 is being rotated and the etchant is dropped to the substrate from an upside of the substrate 1 so as to etch the backside surface 22 of the substrate 1. This method provides that the substrate 1 is etched with the etchant and rinsed with a wash fluid repeatedly, since the substrate 1 is being rotated. Here, the surface roughness RS can be controlled by a rotation speed of the substrate 1 and by each concentration of the acids in the mixed etchant. Thus, the surface roughness RS is set to be a predetermined value.

Figure 5:
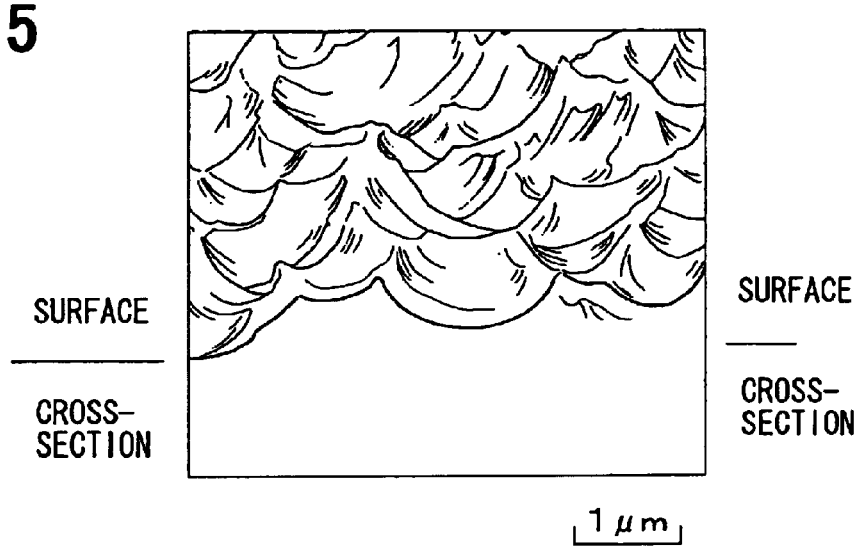
FIG. 5 is a perspective view showing the device after wet-etching, according to the first embodiment.

FIG. 5 is a perspective view showing the wet-etched surface (i.e., the backside surface 22) of the substrate 1 after being roughly etched with using the mixed etchant. FIG. 5 is obtained by the SEM, and the wet-etched substrate 1 is cut and observed obliquely from an upper side of the substrate 1, so that the perspective view shown in FIG. 5 is obtained. As shown in FIG. 5, the wet-etched surface of the substrate 1 has a sharp concavity and convexity, which has a plurality of sharp protrusions. This concavity and convexity is formed almost regularly compared with the polished surface shown in FIG. 4. Further, no crack is observed in FIG. 5. The surface roughness RS of the wet-etched surface is 1.053, i.e., RS=1.053. After wet-etching, the wet-etched surface of the substrate 1 is washed with using ultra-purified water.

Next, as shown Step S4 in FIG. 2, the backside electrode 26 is formed on the wet-etched surface of the substrate 1. The backside electrode 26 is made of metallic material such as titanium (i.e., Ti), vanadium (i.e., V), chromium (i.e., Cr), nickel (i.e., Ni), and gold (i.e., Au). For example, a multi-layer film as the backside electrode 26 made of Ti—Ni—Au is formed on the backside surface 22 of the substrate 1 with using sputtering method. When the substrate 1 is not bent, the thickness of the backside electrode 26 can be about 0.1 $\mu$m. Thus, the silicon layer thickness ST of the device 100 becomes to be a predetermined thickness, as shown in FIG. 1.

Figure 6:
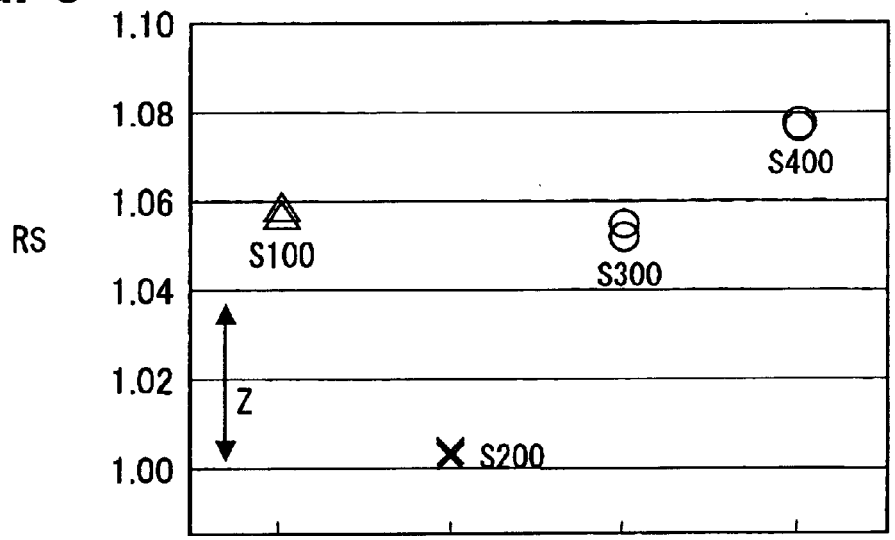
FIG. 6 is a graph showing the surface roughness of different sample, according to the first embodiment.

FIG. 6 shows the surface roughness RS of different samples S100–S400. Each sample S100–S400 is polished mechanically, or wet-etched, and then the backside electrode 26 is formed on each surface of the samples S100–S400.

A sample S100 has a P-type substrate 1 with an impurity concentration of $1\times10^{16}$ cm$^{-3}$, and the backside surface 22 of the substrate 1 is polished roughly with using No. 325 abrasive grains. Then, the backside electrode 26 is formed on the polished surface of the substrate 1. The polished surface of the sample S100 has the surface roughness RS of 1.056, and is a rough piriform surface, so that the bonding strength between the substrate 1 and the backside electrode 26 is sufficiently strong. Further, the backside electrode 26 connects to the substrate 1 with ohmic contact, so that the contact resistance of the backside electrode 26 is 2 mΩ·mm$^2$, which is sufficiently low. However, when the silicon layer thickness ST of the substrate 1 becomes smaller than 300 $\mu$m, the substrate 1 is bent. As shown in FIG. 4, the polished surface of the sample S100, which is polished with using No. 325 abrasive grains, has a plurality of cracks and an irregular concavity and convexity on the backside surface 22. Therefore, the cracks may cause the substrate to bend.

A sample S200 has a P-type substrate 1 with an impurity concentration of $1\times10^{16}$ cm$^{-3}$, and the backside surface 22 of the substrate 1 is polished roughly with using No. 325 abrasive grains. Then, the polished surface is sensitively polished again with using No. 2000 abrasive grains. Then, the backside electrode 26 is formed on the sensitively polished surface of the substrate 1. The sensitively polished surface of the sample S200 has the surface roughness RS of 1.004, and is a mirror finished surface. Even when the silicon layer thickness ST of the substrate 1 becomes smaller than 300 $\mu$m, the substrate 1 is not bent. However, the bonding strength between the substrate 1 and the backside electrode 26 is weak, so that the backside electrode 26 is peeled off from the substrate 1 easily. Further, the backside electrode connects to the substrate 1 with non-ohmic contact, so that the contact resistance of the backside electrode 26 is 30 mΩ·mm$^2$, which is comparatively large.

Furthermore, several samples (not shown) having a P-type substrate 1 with an impurity concentration of $1\times10^{16}$ cm$^{-3}$ are examined. These samples are polished roughly with using different number abrasive grains, and then, the polished surface is sensitively polished again with using different number abrasive grains. Then, the backside electrode 26 is formed on each sensitively polished surface of the samples. To measure the surface roughness RS of each sample, a limitation of bonding strength, which is shown as a region Z in FIG. 6, is obtained. Specifically, in a case where the surface roughness RS is smaller than 1.04, the bonding strength is weak, so that the backside electrode 26 is peel off from the substrate 1 easily.

A sample S300 has a P-type substrate 1 with an impurity concentration of $1\times10^{16}$ cm$^{-3}$, and the backside surface 22 of the substrate 1 is polished roughly with using No. 325 abrasive grains. Then, the polished surface is sensitively polished again with using No. 2000 abrasive grains. Then, the sensitively polished surface is wet-etched with using the mixed etchant. Then, the backside electrode 26 is formed on the wet-etched surface of the substrate 1. The wet-etched surface of the sample S300 has the surface roughness RS of 1.053, and is a piriform surface, so that the bonding strength between the substrate 1 and the backside electrode 26 is sufficiently strong. Further, the backside electrode 26 connects to the substrate 1 with ohmic contact, so that the contact resistance of the backside electrode 26 is 8 mΩ·mm$^2$, which is comparatively low.

A sample S400 has an N-type substrate 1 with an impurity concentration of $1 \times 10^{19}$ cm$^{-3}$, and the backside surface 22 of the substrate 1 is polished roughly with using No. 325 abrasive grains. Then, the polished surface is sensitively polished again with using No. 2000 abrasive grains. Then, the sensitively polished surface is wet-etched with using the mixed etchant. Then, the backside electrode 26 is formed on the wet-etched surface of the substrate 1. The wet-etched surface of the sample S400 has the surface roughness RS of 1.076, and is a piriform surface, so that the bonding strength between the substrate 1 and the backside electrode 26 is sufficiently strong. Further, the backside electrode 26 connects to the substrate 1 with ohmic contact, so that the contact resistance of the backside electrode 26 is 8 mΩ·mm$^2$, which is comparatively low.

As described above, in a case where the backside surface 22 of the substrate 1 is polished and wet-etched, the backside electrode 26 connects to the backside surface 22 of the substrate 1 with ohmic contact. This is because the mixed etchant etches and eliminates an amorphous layer on the backside surface 22. Here, the amorphous layer is formed on the backside surface when the backside surface is sensitively polished with using the small abrasive grains. This amorphous layer prevents the backside electrode from connecting with ohmic contact. Further, the backside surface 22 is wet-etched so that the surface roughness RS of the backside surface 22 becomes equal to or larger than 1.04. Therefore, the wet-etched surface becomes the piriform surface, which has a large contact area, so that the backside electrode 26 connects to the substrate 1 strongly, and has a low contact resistance. Thus, the device has high bonding strength between the backside electrode 26 and the substrate 1 and a low contact resistance therebetween.

Here, it is preferred that the impurity concentration in the substrate 1 is in a range between $1 \times 10^{15}$ cm$^{-3}$ and $1 \times 10^{21}$ cm$^{-3}$. That is because the contact resistance between the substrate 1 and the backside electrode 26 becomes large even when the backside surface 22 is wet-etched in a case where the impurity concentration in the substrate 1 becomes smaller than $1 \times 10^{15}$ cm$^{-3}$. In this case, the backside electrode 26 connects to the substrate 1 with non-ohmic contact.

On the other hand, in a case where the impurity concentration in the substrate 1 becomes larger than $1 \times 10^{21}$ cm$^{-3}$, the etching rate of the wet-etching process is substantially small, so that the manufacturing time is long. Therefore, the manufacturing cost is increased. Accordingly, preferably, the impurity concentration in the substrate 1 is in a range between $1 \times 10^{15}$ cm$^{-3}$ and $1 \times 10^{21}$ cm$^{-3}$, so that the backside surface connects to the substrate 1 with ohmic contact, and the manufacturing cost is comparatively low.

Further, it is preferred that the silicon layer thickness ST of the substrate 1 is in a range between 80 μm and 250 μm. The silicon layer thickness ST of the substrate 1 is provided after the substrate 1 is wet-etched. The ON-state resistance of the device 100 having the backside electrode 26 is reduced in accordance with reduction of the resistance of the substrate 1, since the substrate 1 is thinned. Accordingly, it is preferred that the substrate 1 is thinned as much as possible for reducing the ON-state resistance of the device 100. Specifically, when the silicon layer thickness ST of the substrate 1 is equal to or smaller than 250 μm, the ON-state resistance of the device 100 is sufficiently reduced so that the device 100 can be used as an ordinary electronic device. On the other hand, when the silicon layer thickness ST of the substrate 1 becomes smaller than 80 μm, it is difficult to treat or to carry the substrate 1 in the manufacturing process. Further, in this case, the manufacturing cost is increased. Accordingly, when the silicon layer thickness ST of the substrate 1 is set to be in a range between 80 μm and 250 μm, the device 100 has the low ON-state resistance, and the manufacturing cost of the device 100 is reduced.

Thus, the device 100 is completed in Step S1 to S4 shown in FIG. 2. Next, the substrate 1, i.e., the silicon wafer, with the completed device 100 is cut into a plurality of chips 101 in Step S5 so that the device 100 is divided individually. Then, in Step S6, the individual chip 101 is mounted on a heat radiation plate (not shown) with using solder. Then, the chip 101 is resin-molded with using a transfer molding method and the like, so that the chip 101 is packaged. Here, it is preferred that the chip being molded with resin is thin as much as possible. That is because a shear stress of the packaged chip 102 becomes small so that the stress in the chip 101 is reduced in a case where the thickness of the packaged chip 102 is thin. Therefore, the resin is limited from peeling off from the chip 101 or thermal fatigue of the solder is limited from generating.

Figure 7:
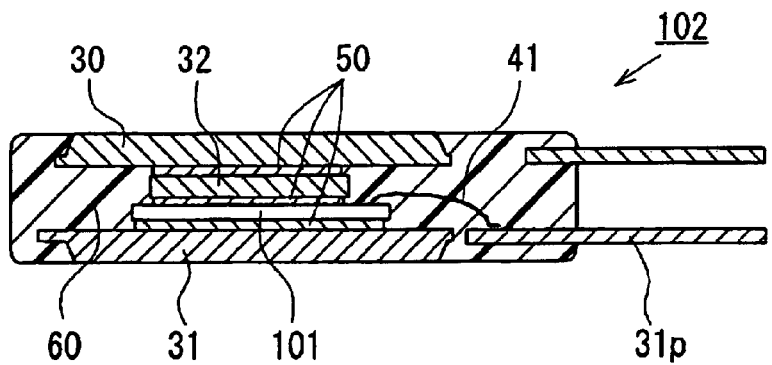
FIG. 7 is a cross-sectional view showing a packaged chip, according to the first embodiment.

FIG. 7 shows the packaged chip 102 with the individual chip 101. The packaged chip 102 includes an upper and lower heat radiation plates 30, 31, and an intermediate heat radiation 32. These heat radiation plates 30–32 are made of a heat conductive material such as copper (i.e., Cu) and aluminum (i.e., Al). The packaged chip 102 further includes a lead pin 31*p* and a bonding wire 41. The foreside surface and backside surface of the individual chip 101 are sandwiched by the lower and intermediate heat radiation plates 31, 32 through a solder 50, respectively. Further, the intermediate heat radiation plate 32 is bonded to the upper heat radiation plate 30 through the solder 50. The solder 50 is made of, for example, tin (i.e., Sn). Further, the individual chip 101 is molded with resin 60.

As shown in FIG. 7, the individual chip 101 generates heat, and the heat conducts and radiates from the upper and lower heat radiation plates 30, 31. Specifically, the heat radiates from the upper surface of the upper heat radiation plate 30, which is exposed outside from the resin 60, and also the heat radiates from the lower surface of the lower heat radiation plate 31, which is exposed outside from the resin 60. Thus, the heat generated in the individual chip 101 radiates through the upper, intermediate and lower heat radiation plates 30–32 effectively, so that the device 100 can be applied to a large power electronic device.

The coefficient of thermal expansion of the individual chip 101 is different from that of the heat radiation plates 31, 32, which is made of copper, aluminum or the like. Therefore, it is preferred that the packaged chip 102 has a relaxation means for relaxing the difference of the coefficient of thermal expansion between the individual chip 101 and the heat radiation plates 31, 32 so as to prevent a crack in the individual chip 101 or a peeling off between the individual chip 101 and the heat radiation plates 31, 32 because of the difference of the coefficient of thermal expansion. This relaxation means is such that the thickness of the individual chip 101 is thinned as much as possible so that the coefficient of heat expansion of the individual chip 101 achieves to that of the heat radiation plates 31, 32 as much as possible.

In this embodiment, the individual chip 101 is not bent, and has a predetermined thickness. The inventors have examined the crack in the individual chip 101, the peeling off of the individual chip 101 and the thermal fatigue of the solder 50 in accordance with a thermal cycle test. The result shows that the crack, the peeling off and the thermal fatigue are reduced sufficiently in a case where the silicon layer thickness ST of the individual chip 101 is equal to or smaller than 150 μm. Thus, when the silicon layer thickness ST of the individual chip 101, i.e., the thickness of the substrate 1 and the drain 2, (i.e., the thickness of silicon layer) is equal to or smaller than 150 μm, the packaged chip 102 has high reliability to operate for a long time.

(Second Embodiment)

Figure 8:
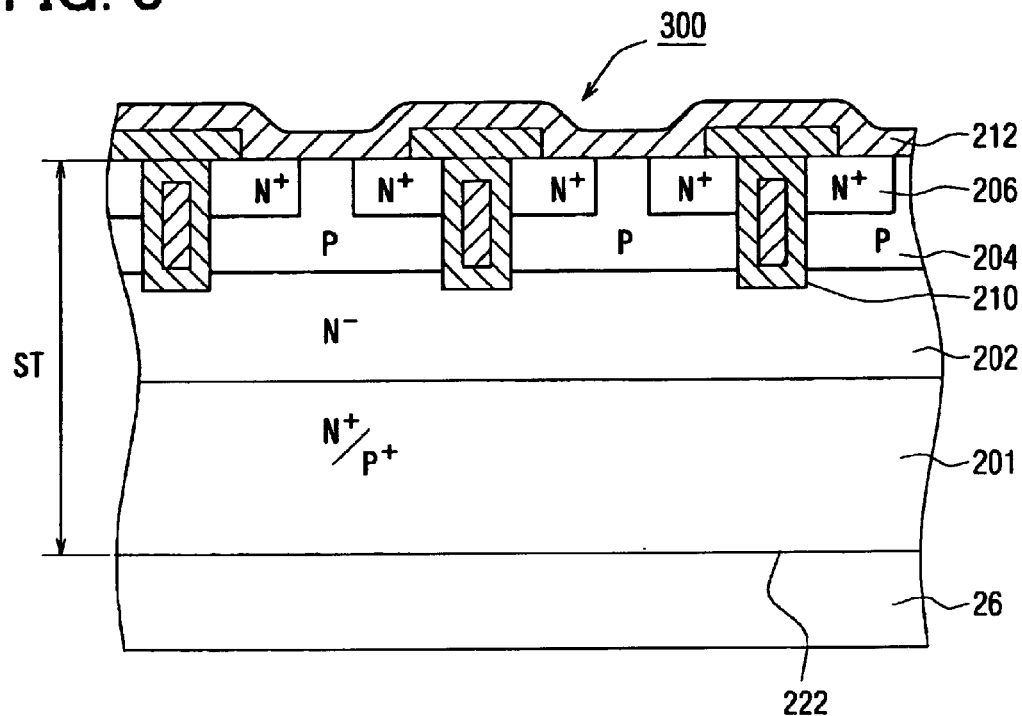
FIG. 8 is a cross-sectional view showing a trench gate type semiconductor device according to a second embodiment of the present invention.
Figure 9:
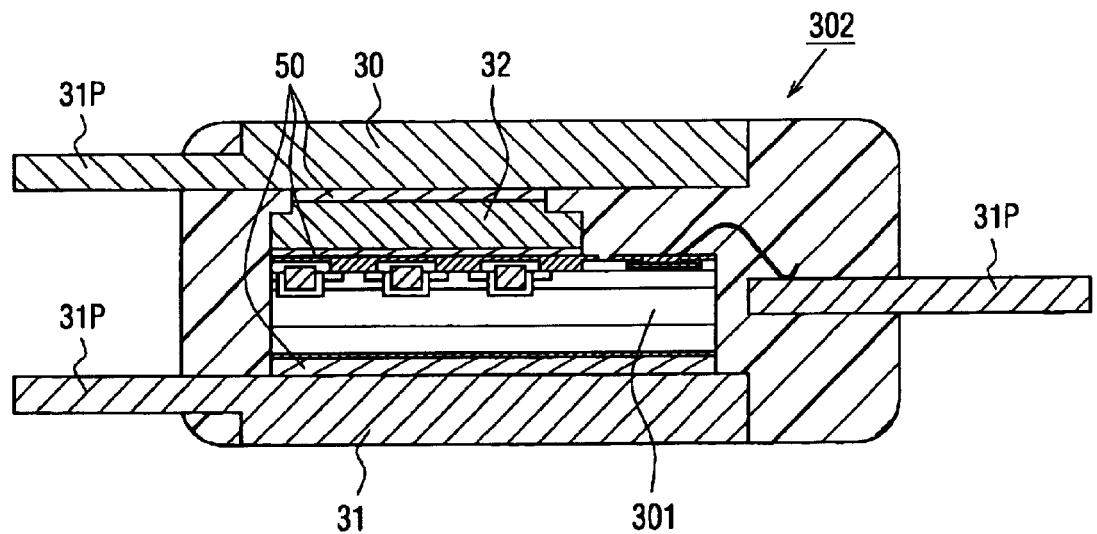
FIG. 9 is a cross-sectional view showing a packaged chip with the trench gate type semiconductor device, according to the second embodiment.

A trench gate type device 300 according to a second embodiment of the present invention is shown in FIGS. 8 and 9. As shown in FIG. 8, the trench gate type device 300 includes a substrate 201 having the first semiconductor layer. The substrate 201 has $P^+$-type conductivity and the first semiconductor layer has $N^+$-type conductivity. On the substrate 201, the second semiconductor layer 202 having $N^-$-type conductivity is formed. A P-type channel layer 204 is formed on the second semiconductor layer 202, and in the channel layer 204, an $N^+$-type source 206 and a gate electrode 210 are formed. On the channel layer 204, a source electrode 212 is formed. Here, the gate electrode 210 penetrates through the channel layer 204 and reaches the second semiconductor layer 202. The backside electrode 26 is formed on a backside surface 222 of the substrate 201.

The backside surface 222 is polished and wet-etched with using the above-described method. Then, the backside electrode 26 is formed on the backside surface 222. Next, the substrate, i.e., the silicon wafer having the device 300 is cut into a plurality of chips 301, and the chip 301 is packaged so that a packaged chip 302 is completed. Here, the silicon layer thickness ST of the substrate 201 is defined as a sum of thickness of the substrate 201, the thickness of the second semiconductor layer 202 and the thickness of the channel 204.

The device 300 has low ON-state resistance and high contact strength. Further, the device 300 can be applied to a large power electronic device. Furthermore, the packaged chip 302 has high reliability to operate for a long time. Specifically, in a case where the packaged chip 302 with the trench gate type device 300 has a pair of heat radiation plates 30–32 disposed on both sides of the packaged chip 302, the backside surface 222 of the substrate 201 is polished and wet-etched so that the crack on the backside surface 222 of the individual chip 301, the peeling off of the individual chip 301 and the thermal fatigue of the solder 50 are reduced.

(Modifications)

Although the wet etching method is the spin etching method, the wet etching method can be another method such as a pot etching method. Here, the pot etching method is described as follows. The polished substrate 1, 201 is mounted in an etching pot, so that part of the backside surface 22, 222 of the substrate 1, 201 is dipped into an etchant for wet-etching part of the backside surface 22, 222 of the substrate 1, 201. In this method, a periphery of the substrate 1, 201 is fixed during the partial wet-etching process. Therefore, the substrate 1, 201 is limited from bending in accordance with the wet-etching process. Thus, the individual chip 101, 301 can be cut from the wafer without bending.

Although the device is the vertical type power electronic device shown in FIG. 1, the device can be another vertical type device such as an insulated gate bipolar transistor (i.e., IGBT), a static induction transistor (i.e., SIT) and a static induction thyristor (i.e., SI thyristor).

Such changes and modifications are to be understood as being within the scope of the present invention as defined by the appended claims.

What is claimed is:

1. A method for manufacturing a semiconductor device with a substrate having a device layer disposed on one side of the substrate and a backside electrode disposed on the other side of the substrate, wherein a surface roughness of the substrate, i.e., RS, is defined as a ratio between a substantial area, i.e., SE, and a projected area, i.e., SP, so that the surface roughness is obtained as RS=SE/SP, the substantial area is an area, which is provided by spreading out a concavity and convexity of a surface of the substrate into a predetermined plane, and the projected area is an area, which is provided by projecting the concavity and convexity of the surface to the predetermined plane, the method comprising the steps of:

polishing the other side of the substrate mechanically with using predetermined abrasive grains so that a silicon layer thickness of the substrate becomes a predetermined thickness;

wet-etching the other side of the substrate after the step of polishing the other side of the substrate so that a surface roughness of the other side of the substrate becomes to be equal to or larger than 1.04; and forming the backside electrode on the other side of the substrate after the step of wet-etching the other side of the substrate.

2. The method according to claim 1, wherein the step of wet-etching is performed with using a spin etching method by a mixed etchant of hydrofluoric acid, nitric acid and sulfuric acid.

3. The method according to claim 1, wherein the predetermined abrasive grains in the step of polishing is abrasive grains having the number of abrasive grains being equal to or larger than 2000 so that the surface roughness of the other side of the substrate becomes to be equal to or smaller than 1.004, the number of abrasive being defined in Japanese Industrial Standards.

4. The method according to claim 1, wherein the step of polishing includes the steps of:

polishing roughly the other side of the substrate mechanically with using first number abrasive grains so that the surface roughness of the other side of the substrate becomes to be equal to or smaller than 1.056; and polishing sensitively the other side of the substrate with using second number abrasive grains after the step of polishing roughly so that that the surface roughness of the other side of the substrate becomes to be equal to or smaller than 1.004, wherein the first number abrasive grains in the step of polishing roughly is abrasive grains having the number of abrasive grains being equal to or larger than 325, wherein the second number abrasive grains in the step of polishing roughly is abrasive grains having the number of abrasive grains being equal to or larger than 2000, and wherein the number of abrasive is defined in Japanese Industrial Standards.

5. The method according to claim 4,
wherein the step of wet-etching is performed with using a spin etching method by a mixed etchant of hydrofluoric acid, nitric acid and sulfuric acid, and
wherein the substrate has a silicon layer thickness in a range between 80 μm and 250 μm after the step of wet-etching the other side of the substrate, the silicon layer thickness is defined as a total thickness of silicon layer.

6. The method according to claim 5,
wherein the substrate has an impurity concentration in a range between $1 \times 10^{15}$ cm$^{-3}$ and $1 \times 10^{21}$ cm$^{-3}$, and
wherein the substrate has a thickness in a range between 80 μm and 150 μm.

7. A method for manufacturing a semiconductor device with a substrate having a device layer disposed on one side of the substrate and a backside electrode disposed on the other side of the substrate, wherein a surface roughness of the substrate, i.e., RS, is defined as a ratio between a substantial area, i.e., SE, and a projected area, i.e., SP, so that the surface roughness is obtained as RS=SE/SP, the substantial area is an area, which is provided by spreading out a concavity and convexity of a surface of the substrate into a predetermined plane, and the projected area is an area, which is provided by projecting the concavity and convexity of the surface to the predetermined plane, the method comprising the steps of:
polishing the other side of the substrate mechanically with using predetermined abrasive grains so that a silicon layer thickness of the substrate becomes a predetermined thickness;
wet-etching the other side of the substrate after the step of polishing the other side of the substrate so that a surface roughness of the other side of the substrate becomes to be equal to or larger than 1.04; and
forming the backside electrode on the other side of the substrate after the step of wet-etching the other side of the substrate,
wherein the predetermined abrasive grains in the step of polishing is abrasive grains having the number of abrasive grains being equal to or larger than 325 so that the surface roughness of the other side of the substrate becomes to be equal to or smaller than 1.056, the number of abrasive being defined in Japanese Industrial Standards.

8. The method according to claim 7,
wherein the step of wet-etching is performed with using a spin etching method by a mixed etchant of hydrofluoric acid, nitric acid and sulfuric acid.

9. The method according to claim 7,
wherein the predetermined abrasive grains in the step of polishing is abrasive grains having the number of abrasive grains being equal to or larger than 2000 so that the surface roughness of the other side of the substrate becomes to be equal to or smaller than 1.004, the number of abrasive being defined in Japanese Industrial Standards.

10. The method according to claim 7,
wherein the step of polishing includes the steps of:
polishing roughly the other side of the substrate mechanically with using first number abrasive grains so that the surface roughness of the other side of the substrate becomes to be equal to or smaller than 1.056; and
polishing sensitively the other side of the substrate with using second number abrasive grains after the step of polishing roughly so that that the surface roughness of the other side of the substrate becomes to be equal to or smaller than 1.004,
wherein the first number abrasive grains in the step of polishing is abrasive grains having the number of abrasive grains being equal to or larger than 325,
wherein the second number abrasive grains in the step of polishing is abrasive grains having the number of abrasive grains being equal to or larger than 2000, and
wherein the number of abrasive is defined in Japanese Industrial Standards.

11. The method according to claim 10,
wherein the step of wet-etching is performed with using a spin etching method by a mixed etchant of hydrofluoric acid, nitric acid and sulfuric acid, and
wherein the substrate has a silicon layer thickness in a range between 80 μm and 250 μm after the step of wet-etching the other side of the substrate, the silicon layer thickness is defined as a total thickness of silicon layer.

12. The method according to claim 11,
wherein the substrate has an impurity concentration in a range between $1 \times 10^{15}$ cm$^{-3}$ and $1 \times 10^{21}$ cm$^{-3}$, and
wherein the substrate has a thickness in a range between 80 μm and 150 μm.

13. The method according to claim 7,
wherein the device is a power electronic device.

14. The method according to claim 7, further comprising the steps of:
forming a pair of heat radiation plates to sandwich the device layer and the backside electrode through a solder; and
molding the heat radiation plates with a resin.

* * * * *